United States Patent
Wang et al.

(10) Patent No.: US 9,721,767 B2
(45) Date of Patent: Aug. 1, 2017

(54) EMBEDDED MASK PATTERNING PROCESS FOR FABRICATING MAGNETIC MEDIA AND OTHER STRUCTURES

(71) Applicant: Regents of the University of Minnesota, Minneapolis, MN (US)

(72) Inventors: Jian-Ping Wang, Shoreview, MN (US); Hao Wang, St. Paul, MN (US); Haibao Zhao, San Jose, CA (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 14/422,262

(22) PCT Filed: Aug. 21, 2013

(86) PCT No.: PCT/US2013/056031
§ 371 (c)(1),
(2) Date: Feb. 18, 2015

(87) PCT Pub. No.: WO2014/031772
PCT Pub. Date: Feb. 27, 2014

(65) Prior Publication Data
US 2015/0221483 A1    Aug. 6, 2015

Related U.S. Application Data

(60) Provisional application No. 61/691,681, filed on Aug. 21, 2012.

(51) Int. Cl.
*H01J 37/32*    (2006.01)
*C23C 16/44*    (2006.01)
*G11B 5/855*    (2006.01)

(52) U.S. Cl.
CPC ........ *H01J 37/32899* (2013.01); *C23C 16/44* (2013.01); *G11B 5/855* (2013.01)

(58) Field of Classification Search
None
See application file for complete search history.

(56) References Cited

U.S. PATENT DOCUMENTS 4,407,695 A * 10/1983 Deckman ................. B41M 5/24
204/192.34
4,957,591 A * 9/1990 Sato ........................ C01B 31/06
204/192.35

(Continued)

OTHER PUBLICATIONS

International Preliminary Report on Patentability from counterpart International Patent Application No. PCT/US2013/056031, dated Feb. 24, 2015, 6 pp.

(Continued)

*Primary Examiner* — Allan Olsen
(74) *Attorney, Agent, or Firm* — Shumaker & Sieffert, P.A.

(57) ABSTRACT

In some examples, a method comprising depositing a functional layer (e.g., a magnetic layer) over a substrate; depositing a granular layer over the functional layer, the granular layer including a first material defining a plurality of grains separated by a second material defining grain boundaries of the plurality of grains; removing the second material from the granular layer such that the plurality of grains of the granular layer define a hard mask layer on the functional layer; and removing portions of the functional layer not masked by the hard mask layer, wherein the depositing of the functional layer, the depositing of the granular layer, removing the second material, and removing the portions of the functional layer are performed in a vacuum environment.

66 Claims, 10 Drawing Sheets

(56) References Cited

U.S. PATENT DOCUMENTS

| | | | | |
|---|---|---|---|---|
| 5,372,962 | A * | 12/1994 | Hirota | H01L 27/10808 148/DIG. 138 |
| 5,676,853 | A * | 10/1997 | Alwan | G03F 1/14 216/11 |
| 5,966,612 | A * | 10/1999 | Wu | H01L 28/92 257/E21.012 |
| 6,037,104 | A * | 3/2000 | Lahaug | H01J 9/025 216/11 |
| 6,051,149 | A * | 4/2000 | Frendt | B82Y 10/00 216/11 |
| 6,068,878 | A * | 5/2000 | Alwan | H01J 9/025 427/180 |
| 6,174,449 | B1 * | 1/2001 | Alwan | H01J 9/025 216/42 |
| 6,228,538 | B1 * | 5/2001 | Michiels | G03F 1/14 257/E21.024 |
| 6,372,404 | B1 * | 4/2002 | Wells | G03F 1/14 430/270.1 |
| 6,518,194 | B2 * | 2/2003 | Winningham | B81C 1/00396 216/17 |
| 6,524,874 | B1 * | 2/2003 | Alwan | B82Y 20/00 438/20 |
| 7,018,944 | B1 * | 3/2006 | Carnahan | B82Y 30/00 438/736 |
| 7,158,346 | B2 | 1/2007 | Liu et al. | |
| 7,166,538 | B2 * | 1/2007 | Doshita | H01L 21/32137 257/E21.311 |
| 8,586,142 | B2 * | 11/2013 | Himmelhaus | C23C 14/042 427/248.1 |
| 9,034,684 | B2 * | 5/2015 | Zhang | H01L 31/02366 438/71 |
| 2003/0022403 | A1 * | 1/2003 | Shimoda | B82Y 10/00 438/14 |
| 2003/0052080 | A1 * | 3/2003 | Baik | C01B 33/06 216/24 |
| 2007/0116989 | A1 * | 5/2007 | Ikekame | G11B 5/855 428/828.1 |
| 2008/0260941 | A1 * | 10/2008 | Jin | B01J 35/0013 427/126.4 |
| 2009/0242416 | A1 * | 10/2009 | Yun | B81B 3/0021 205/181 |
| 2009/0250588 | A1 * | 10/2009 | Robeson | H01L 29/06 249/187.1 |
| 2011/0143169 | A1 | 6/2011 | Albrecht et al. | |
| 2012/0015143 | A1 * | 1/2012 | Chyan | B82Y 30/00 428/141 |
| 2012/0140357 | A1 | 6/2012 | Yakushiji et al. | |
| 2012/0214001 | A1 * | 8/2012 | Little | B01J 13/18 428/403 |
| 2013/0180948 | A1 * | 7/2013 | Takizawa | G11B 5/855 216/22 |
| 2013/0280908 | A1 * | 10/2013 | Li | H01L 21/30612 438/674 |
| 2014/0104606 | A1 * | 4/2014 | Shih | G01N 21/658 356/301 |
| 2014/0295208 | A1 * | 10/2014 | Fan | H01L 31/02366 428/606 |

OTHER PUBLICATIONS

International Search Report and Written Opinion from counterpart International Patent Application No. PCT/US2013/056031, dated Dec. 4, 2013, 8 pp.

Granz et al., "Granular L10 FePt—B and FePt—B—Ag (001) Thin Films for Heat Assisted Magnetic Recording," Journal of Applied Physics, vol. 111, 07B709, Mar. 8, 2012, 4 pp.

Park et al., "Prospect of Recording Technologies for Higher Storage Performance," IEEE Transactions on Magnetics, vol. 47, No. 3, Mar. 2011, pp. 539-545.

Shafidah et al., "Application of the Grain Flipping Probability Model to Heat Assisted Magnetic Recording," Journal of Applied Physics, vol. 111, Mar. 12, 2012, 4 pp.

Yang et al., "Structure and Magnetic Properties of L10-FePt Thin Films on TiN/RuAl Underlayers," Journal of Applied Physics, vol. 109, Apr. 13, 2011, 4 pp.

Wang et al., "Spontaneously-formed FePt graded granular media with a large gain factor," IEEE Magnetics Letters, vol. 3, 450014, Apr. 3, 2012, 4 pp.

Rahman et al., "Exploration of the Direct Use of Anodized Alumina as a Mold for Nanoimprint Lithography to Fabricate Magnetic Nanostructure over Large Area," Journal of Nanotechnology, vol. 2011, Article ID 961630, Aug. 24, 2011, 6 pp.

Zhao et al., "Fabrication of Ultrathin L10-FePt Based Exchange Coupled Composite Media," Journal of Applied Physics, vol. 111, No. 7, 07B732, Proceedings of the 56th Annual Conference on Magnetism and Magnetic Materials, Oct. 30-Nov. 3, 2011, 4 pp.

Zhao et al., "Microstructure Study of Pinning Sites of Highly (0001) Textured Sm(Co,Cu)5 Thin Films Grown on Ru Underlayer," Journal of Applied Physics, vol. 111, No. 7, 07B730, Proceedings of the 56th Annual Conference on Magnetism and Magnetic Materials, Oct. 30-Nov. 3, 2011, 4 pp.

Ma et al. "Structural and magnetic properties of a core-shell type L10 FePt/Fe exchange coupled nanocomposite with tilted easy axis," Journal of Applied Physics, vol. 109, No. 8, 083907, Apr. 18, 2011, 8 pp.

Zhao et al., "Chemical Stability of Highly (0001) Textured Sm(CoCu)5 Thin Films with a Thin Ta Capping Layer," Journal of Applied Physics, vol. 109, No. 7, 07B715, Proceedings of the 55th Annual Conference on Magnetism and Magnetic Materials, Nov. 14-18, 2010, 4 pp.

Ma et al., "L10 FePt/Fe Exchange Coupled Composite Structure on MgO Substrates," IEEE Transactions on Magnetics, vol. 46, No. 6, Jun. 2010, 4 pp.

Terris, "Fabrication challenges for patterned recording media," Journal of Magnetism and Magnetic Materials, vol. 321, Elsevier B.V., Jun. 10, 2008, 8 pp.

McCallum et al., "L10 FePt based exchange coupled composite bit patterned films," Applied Physics Letters, vol. 98, No. 24, 242503, Jun. 13, 2011, 4 pp.

Bublat et al., "Influence of dot size and annealing on the magnetic properties of large-area L10-FePt nanopatterns," Journal of Applied Physics, vol. 110, No. 7, 073908, Oct. 11, 2011, 8 pp.

Zhang et al., "FePtAg—C Nanogranular Film as Thermally Assisted Magnetic Recording (TAR) Media," IEEE Transactions on Magnetics, vol. 47, No. 10, Oct. 2011, 6 pp.

Mosendz et al., "Ultra-high coercivity small-grain FePt media for thermally assisted recording (invited)," Journal of Applied Physics, vol. 111, No. 7, 07B729, Proceedings of the 56th Annual Conference on Magnetism and Magnetic Materials, Oct. 30-Nov. 3, 2011, 3 pp.

Dong et al., "Well-isolated L10 FePt-SiNx-C nanocomposite films with large coercivity and small grain size," Journal of Applied Physics, vol. 111. No. 7, 07A308, Proceedings of the 56th Annual Conference on Magnetism and Magnetic Materials, Oct. 30-Nov. 3, 2011, 4 pp.

Weller et al., "High Ku Materials Approach to 100 Gbits/in2," IEEE Transaction on Magnetics, vol. 36, No. 1, Jan. 2000, 6 pp.

Kryder et al., "Heat Assisted Magnetic Recording," Invited Paper, Proceedings of the IEEE, vol. 96, No. 11, Nov. 2008, 26 pp.

Hu et al., "High-Moment Antiferromagnetic Nanoparticles with Tunable Magnetic Properties," Advanced Materials, Apr. 4, 2008, 5 pp.

Wang et al., "Fabrication of FePt Type Exchange Coupled Composite Bit Patterned Media by Block-copolymer Lithography," Journal of Applied Physics, vol. 109, No. 7, 07B754, Proceedings of the 55th Annual Conference on Magnetism and Magnetic Materials, Nov. 14-18, 2010, 4 pp.

Wang et al., "Characterization of L10-FePt/Fe based exchange coupled composite bit pattern media," Journal of Applied Physics, vol. 111, No. 7, 07B914, Proceedings of the 56th Annual Conference on Magnetism and Magnetic Materials, Oct. 30-Nov. 3, 2011, 4 pp.

(56) References Cited

OTHER PUBLICATIONS

Lee et al., "Self-Assembled Plasmonic Nanohole Arrays," Langmuir Articles, American Chemical Society, vol. 25, No. 23, Oct. 15, 2009, pp. 13685-13693.

Wen et al., "Ultra-Large-Area Self-Assembled Monolayers of Nanoparticles," ACSNANO, vol. 5, No. 11, Oct. 19, 2011, pp. 8868-8876.

Wang et al., "Natural Fabrication of FePt based Exchange Coupled Composite Media," 53rd Annual Conference on Magnetism, Magnetic Materials, CC-09, Nov. 10-14, 2008, 18 pp.

Wang et al., "FePt Type Exchange Coupled Composite Media and Multilevel Magnetic Recording," 19th The Magnetic Recording Conference (TMRC), BB-3 (invited), Singapore, Jul. 30, 2008, 40 pp.

Invitation pursuant to Rule 137(4) EPC from counterpart European Application No. 13759602.9, dated Dec. 21, 2015, 2 pp.

Response to Communication dated Apr. 17, 2015, from counterpart European Application No. 13759602.9, filed Oct. 16, 2015, 36 pp.

Response to Invitation dated Dec. 21, 2015, from counterpart European Application No. 13759602.9, filed Jan. 19, 2016, 8 pp.

Ho et al., "Quantitative transmission electron microscopy analysis of multi-variant grains in present L10-FePt based heat assisted magnetic recording media," Journal of Applied Physics, vol. 116, 193510, Nov. 20, 2014, 9 pp.

Hu et al., "Microstructure Control of L10 Ordered FePt Granular Film for HAMR Application," IEEE Transactions on Magnetics, vol. 49, No. 7, Jul. 2013, pp. 3737-3740.

Hu et al., "High-Moment Antiferromagnetic Nanoparticles with Tunable Magnetic Properties," Advanced Materials, vol. 20, No. 8, Apr. 21, 2008, pp. 1479-1483.

Huda et al., "Fabrication of 5-nm-Sized Nanodots using Self-Assembly of Polystyrene-Poly(dimethylsiloxane)," Japanese Journal of Applied Physics, Special Issue: Microprocesses and Nanotechnology, vol. 51, No. 6, 06FF10, Jun. 20, 2012, 6 pp.

Shen et al., "In situ epitaxial growth of ordered FePt (001) films with ultra small and uniform grain size using a RuAl underlayer," Journal of Applied Physics, vol. 97, No. 10, 10H301, May 11, 2005, 4 pp.

Shiroyama et al., "Microstructure and Magnetic Properties of FePt—Cr2O3 Films," IEEE Transactions on Magnetics, vol. 50, No. 11, Nov. 2014, 6 pp.

Varaprasad et al., "Columnar Structure in FePt—C Granular Media for Heat-Assisted Magnetic Recording," IEEE Transactions on Magnetics, vol. 51, No. 11, Nov. 2015, 4 pp.

Wang et al., "Novel System Design for Readback at 10 Terabits per Square Inch User Areal Density," IEEE Magnetics Letters, vol. 3, Information Storage, Dec. 20, 2012, 6 pp.

Wang et al., "Embedded mask patterning: A nanopatterning process to fabricate FePt magnetic media," Applied Physics Letters, American Institute of Physics, vol. 102, 052406, Feb. 6, 2013, 7 pp.

Wang et al., "Fabrication and Characterization of FePt Exchange Coupled Composite and Graded Bit Patterned Media," IEEE Transactions on Magnetics, vol. 49, No. 2, Feb. 2013, pp. 707-712.

Weller et al., "A HAMR Media Technology Roadmap to an Areal Density of 4 Tb/in2," IEEE Transactions on Magnetics, vol. 50, No. 1, Jan. 2014, 10 pp.

Zhu et al., "Effect of Mask Erosion on Patterning of FePt for HAMR Media Using Embedded Mask Patterning," MAGCON-15-11-1953R1, IEEE Transactions on Magnetics, Jan. 12, 2016, 5 pp.

Rea et al., "Writer and Reader Head-to-Media Spacing Sensitivity Assessment in HAMR," TMRC 2015—C1, Digests of the 26th Magnetic Recording Conference, Aug. 17, 2015, 6 pp.

Victora et al., Predicted Areal Density Gain for HAMR on Bit Patterned and Granular Media, TMRC 2015—A6, Digests of the 26th Magnetic Recording Conference, Aug. 18, 2015, 6 pp.

U.S. Appl. No. 62/208,438, by Jian-Ping Wang, filed Aug. 21, 2015.

U.S. Appl. No. 62/218,881, by Jian-Ping Wang, filed Sep. 15, 2015.

\* cited by examiner

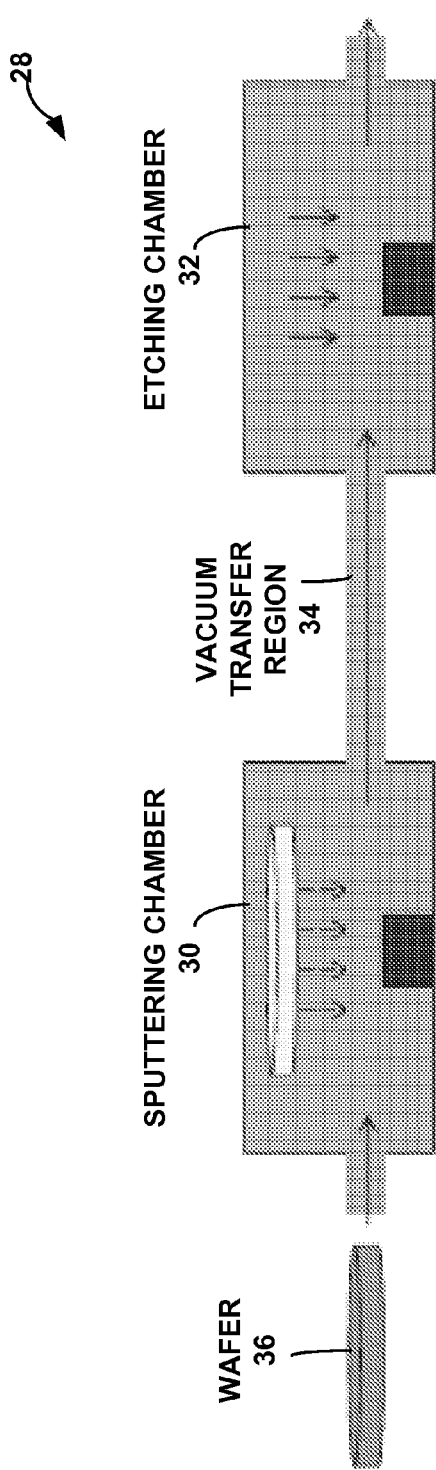
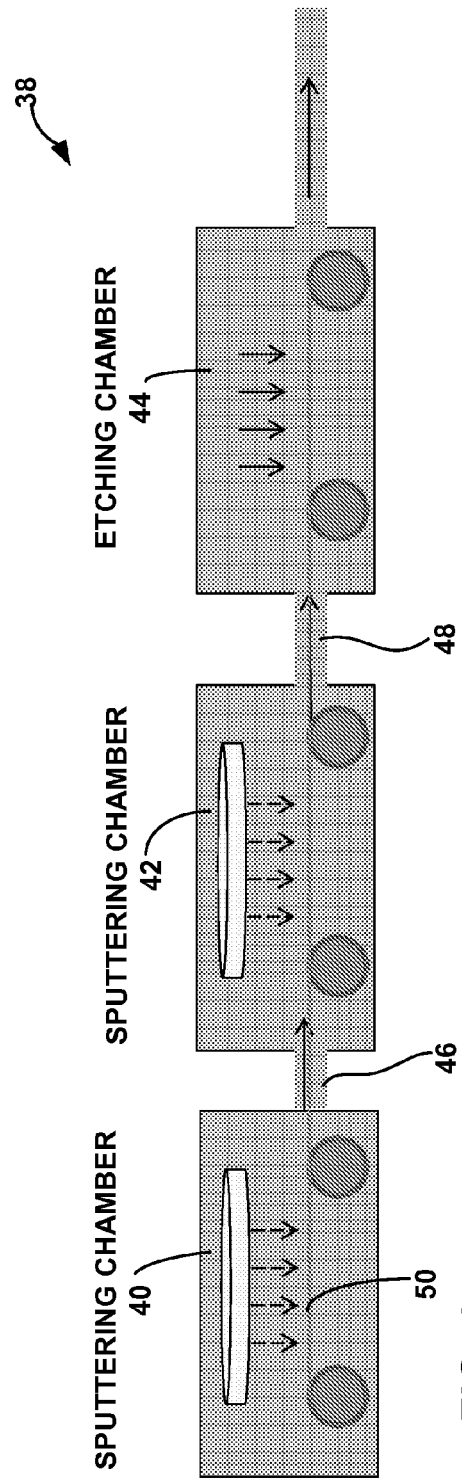

EMBEDDED MASK PATTERNING PROCESS FOR FABRICATING MAGNETIC MEDIA AND OTHER STRUCTURES

This application is a national stage entry under 35 U.S.C. §371 of International Application No. PCT/US2013/056031, filed Aug. 21, 2013, which claims the benefit of U.S. Provisional Application Ser. No. 61/691,681, filed Aug. 21, 2012, the entire contents of each of which are incorporated by reference herein.

TECHNICAL FIELD

This disclosure relates to fabrication techniques for magnetic recording media and other structures.

BACKGROUND

Many different types of magnetic media have been developed to store information. Examples of such magnetic media include hard drives, magnetic diskettes, magnetic tapes, magnetic tape cartridges, magneto-optical disks. Increasing data storage density is desirable in the development of new or improved types of data storage media. Different multi-functional nanostructures are desirable for a variety of applications, including biomedical sensing, therapy, drug delivery, imaging, protein purification, cell separation, hyperthermia or their combinations. It is also desirable to simplify production and reduce production costs.

SUMMARY

Example systems and techniques applicable to the fabrication of magnetic media, such as magnetic hard drives, are described. Also described are a number of articles and structures fabricated using such techniques. Although this disclosure primarily describes example techniques for use in creating magnetic storage media for hard drives, the disclosure is not limited to such examples. For example, the techniques and structures described herein may be applicable to other types of magnetic storage devices, as well as other types of structures or devices. As described below, the systems and techniques of the disclosure may also be employed for fabrication of artificial nanoparticles, nanohole arrays, and other nanostructures.

In one example, the disclosure relates to a method comprising depositing a functional layer over a substrate; depositing a granular layer over the functional layer, the granular layer including a first material defining a plurality of grains separated by a second material defining grain boundaries of the plurality of grains; removing the second material from the granular layer such that the plurality of grains of the granular layer define a hard mask layer on the functional layer; and removing portions of the functional layer not masked by the hard mask layer, wherein the depositing of the functional layer, the depositing of the granular layer, removing the second material, and removing the portions of the functional layer are performed in a vacuum environment.

In another example, the disclosure relates to a system comprising at least one deposition chamber configured to deposit, in a vacuum environment, a functional layer over a substrate, and deposit a granular layer over the functional layer, the granular layer including a first material defining a plurality of grains separated by a second material defining grain boundaries of the plurality of grains; and at least one etching chamber configured to remove, in the vacuum environment, the second material from the granular layer such that the plurality of grains of the granular layer define a hard mask layer on the functional layer, and remove portions of the functional layer not masked by the hard mask layer.

In another example, the disclosure relates to an article fabricated using one or more of the example systems and/or techniques described herein.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF DRAWINGS

FIGS. 3 and 4 are schematic diagrams illustrating example systems for fabricating an article using an embedded hard mask layer within a vacuum environment.

DETAILED DESCRIPTION

Figure 1:
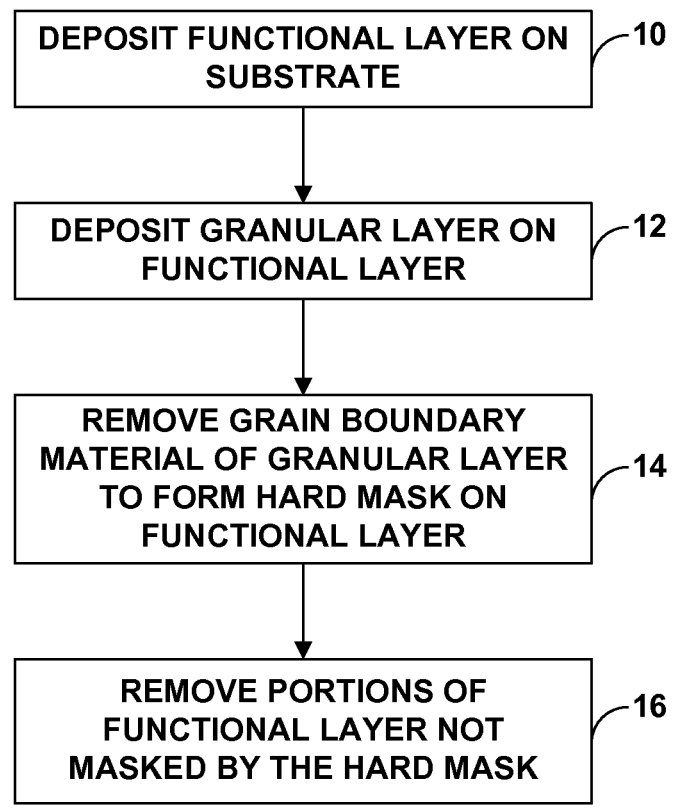
FIG. 1 is a flow diagram illustrating an example technique for fabricating an article using an embedded hard mask layer within a vacuum environment.

Example systems and techniques applicable to the fabrication of magnetic media, such as magnetic hard drives, are described. Also described are a number of articles and structures that may be fabricated using such techniques. Although this disclosure primarily describes example techniques for use in creating magnetic storage media for hard drives, the disclosure is not limited to such examples. For example, the techniques and structures described herein may be applicable to other types of magnetic storage devices, as well as other types of structures or devices. As described below, the systems and techniques of the disclosure may also be employed for fabrication of artificial nanoparticles, nanohole arrays, and other nanostructures. In addition, examples of the disclosure include those details and examples described in U.S. Provisional Patent Application No. 61/691,681, filed Aug. 21, 2012, the entire content of which is incorporated by reference herein.

In some example thin film fabrication techniques, magnetic recording media may be fabricated by depositing magnetic materials and non-magnetic materials together to form granular film that may function as a magnetic recording layer. The grains of the granular film may be made of magnetic materials, and the grain boundaries are made of non-magnetic materials. In such cases, however, as the size of the grains in the granular film is reduced, the magnetic properties of the grains may change undesirably. For example, as the size of the grains decrease, magnetic performances of recording media such as Co alloy media will degrade. FePt media may be desirable for use in recording media because of its high anisotropy constant or less degradation of magnetic performance with the reduction of its grain size. However, it is difficult to fabricate FePt media with small grain size while keeping its good magnetic performances by using traditional sputtering process.

In contrast with such techniques in which such granular films are deposited as the magnetic recording layer, examples of the disclosure include fabrication techniques in which a non-granular magnetic layer may first be deposited on a substrate as substantially continuous thin film. A granular masking layer may then be deposited on the magnetic layer. The masking layer may include two different types of materials, with one material forming the grain and another material forming the grain boundaries. Following the deposition of the granular masking layer, the grain boundary material may be removed (e.g., etched away) to leave a mask defined by the grains of the granular layer. In particular, the grains may function to define a mask for etching away portions of the magnetic layer to transfer the pattern on the grains to the underlying magnetic layer. Following the etching of the magnetic layer, the mask of grains may then be removed, leaving a non-continuous magnetic layer with the desired pattern defined by the mask of grains. In such a manner, the granular masking layer defines the grain size, while the magnetic layer determines the magnetic properties of the recording layer. As such, the grain size of the recording media can be adjusted as desired without changing the recording layer of the media.

Further, as will be described below, the deposition of the magnetic layer and granular masking layer, as well as the steps for removing (e.g., etching) the grain boundary material and, subsequently, unmasked portions of the underlying magnetic layer, may be carried out in a vacuum environment. For example, such steps may be performed within an environment in which the pressure is less than approximately 500 mTorr, such as, e.g., less than approximately 10 mTorr. In some examples, an apparatus may be used to fabricate a magnetic article such that article remains in a vacuum environment throughout the deposition and removal steps without being removed from the vacuum. For example, an apparatus or system may include one or more deposition chambers (e.g., sputtering chambers) in connection with each other by way of one or more transfer regions configured to allow for the transfer of a substrate (e.g., a wafer) between the chambers while maintaining a vacuum environment. In a similar fashion, a transfer region may connect one or more deposition chamber to one or more material removal chambers (e.g., etching chamber). In this manner, the deposition (e.g., sputtering) and removal (e.g., etching) processes may take place without subjecting the fabricated article to a non-vacuum environment, e.g., between formation of the magnetic and granular layers.

In some examples, exposure to a non-vacuum environment during the deposition and/or removal processes may undesirably result in impurities in one or more the thin film layers. For example, in some cases, a magnetic material may be deposited via sputtering in a vacuum environment to form a magnetic film layer. Once the magnetic layer is formed, the article may then be removed from the sputtering chamber and vacuum environment to form a granular layer on the magnetic layer via a spin coating process. However, the removal of the article from the vacuum environment may lead to impurities on and/or in the granular layer such as air borne particles and water vapors. Some example techniques of the disclosure may address such undesired consequences by forming the magnetic thin film layer and granular layer, as well as removing the grain boundary material and portions of the magnetic thin film layer, all while keeping the article in a vacuum environment during the fabrication process.

FIG. 1 is a flow diagram illustrating an example technique for fabricating an article using an embedded hard mask layer within a vacuum environment. As shown, a functional layer may be deposited on a substrate (10) followed by the deposition of a granular layer on the functional layer (12). The grain boundary material of the granular layer may be removed from the granular layer such that the remaining grains form a hard mask on the functional layer (14). Subsequently, the unmasked portions of the functional layer may be removed to formed a patterned functional layer defined by the hard mask (16).

The functional layer may be formed of any suitable material desired for the article to function after fabrication. For example, as described herein, such an example technique may be used to fabricate extremely high magnetic recording media (e.g., with FePt, CoPt, FePd, $SmCo_5$, and/or other suitable hard magnetic materials). The technique may allow for a continuous magnetic thin film with desirable magnetic properties to first be formed first on a substrate (either directly or indirectly) as the functional layer, followed by the formation of small grains in the magnetic layer by removing a portion of the continuous magnetic layer in a patterned defined by an overlying hard mask. As described, the overlaying hard mask may be formed by the grains of a granular film layer. In some examples, the functional layer may include multiple layers (such as, e.g., multiple magnetic layers) to form nanoparticles and/or magnetic recording media. In applications in which the techniques described herein form a nanohole array, the functional layer may be formed of Au, Ag, ZrN, Fe4N, Ni, or combinations thereof, based on the desired properties of the material when employed to form the nanohole array.

Figure 2A:
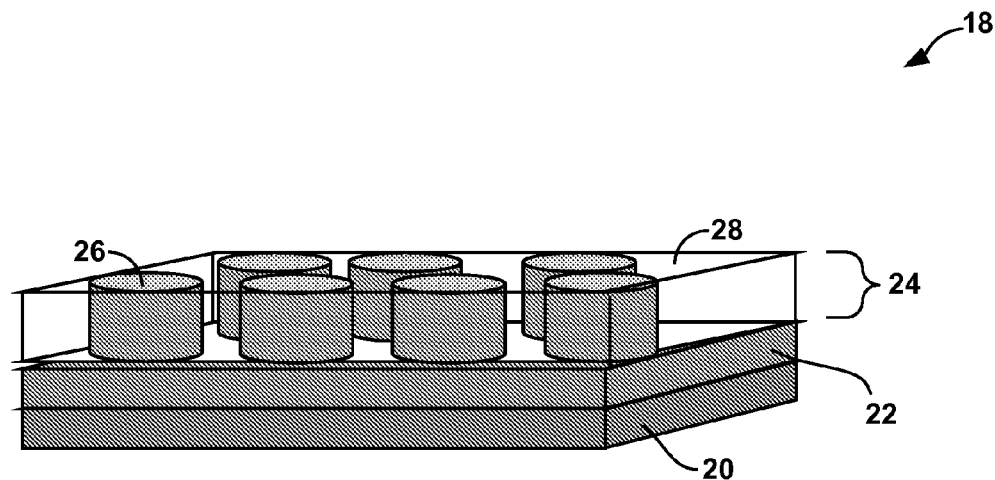
FIGS. 2a-2c are conceptual diagrams illustrating an example article at various times during the fabrication process using an embedded hard mask layer within a vacuum environment.
Figure 2B:
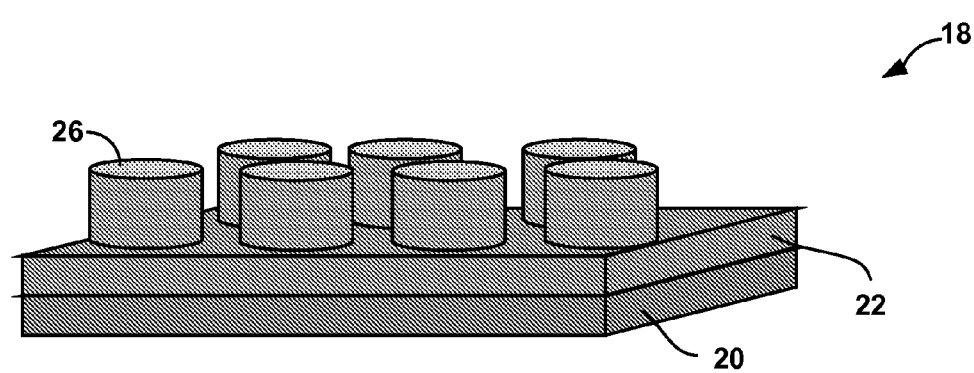
Figure 2C:
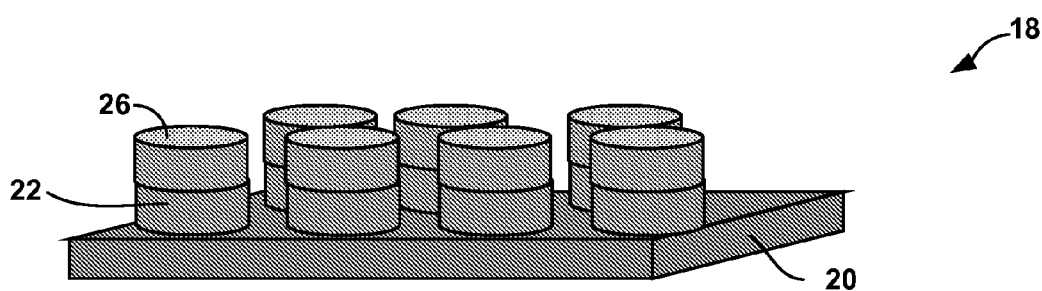

FIGS. 2a-2c are conceptual diagrams illustrating example article 18 at various times during fabrication using an embedded hard mask layer within a vacuum environment. Article 18 may undergo the fabrication described herein to form magnetic recording media, such as, e.g. heat assisted magnetic recording (HAMR) media. For ease of illustrating, the example technique of FIG. 1 will be described with reference to article 18 shown FIGS. 2a-2c. However, articles other than that of article 18 shown in FIGS. 2a-2c may be formed via the example technique of FIG. 1.

As shown in FIG. 1, a hard magnetic material may be deposited on substrate 20 to form magnetic thin film layer 22 (10). Substrate 20 may include any suitable substrate for the fabrication of the magnetic recording media. Example substrate materials include multilayer non-magnetic seedlayer and under layers and soft magnetic layer on top of substrates such as amorphous and nanocrystalline glass, Al—Mg, and MgO. Although article 18 in FIGS. 2a-2c show magnetic thin film layer 22 formed directly on substrate 20, in other examples, one or more intermediate layers may first be deposited on substrate 20 such that magnetic thin film layer 22 is formed indirectly on substrate 20. Such intermediate layers may include material layers suitable for use in magnetic recording media, e.g., a seed or undercoat layer. In some examples, substrate 20 may be pre-patterned with periodical structure, e.g. narrow grooves along circumferential directly.

Magnetic layer 22 may include any hard magnetic suitable for use in magnetic recording media. In some examples, suitable materials include those materials with a relatively high anisotropy while being chemically stable under normal operating conditions for magnetic recording media. Examples of materials used to form magnetic layer 22 include FePt, FePd, CoPt, CoPd, $[Co/Pd]_n$ and $[Co/Pt]_n$ multilayer, TbFeCo, $SmCo_5$, and alloys thereof (e.g. Co alloy).

As described above, in some examples, it may be difficult to reduce the grain size of a magnetic material such as, e.g., FePt without undesirably influencing the magnetic properties of the material (e.g., reducing magnetic coercivity) and maintaining chemical order. In accordance with some examples of the disclosure, magnetic layer 22 may be deposited as a substantially continuous magnetic film layer rather than a granular magnetic film layer including magnetic grains and non-magnetic grain boundaries. The magnetic layer 22 may be deposited as a highly chemically ordered film under high temperature (e.g., highly $L1_0$ ordered FePt film) which exhibits a relatively large anisotropy constant and flat surface.

Following the deposition of magnetic layer 22 on substrate 20, granular layer 24 may be deposited on magnetic layer 22 (12). Granular layer 24 may include a plurality of grains 26 (only a single grain is labeled in FIGS. 2a-c for clarity) formed of a first material and grain boundary 28 formed of a second material. As shown in FIG. 1, following deposition of granular layer 24 (12), grain boundary 28 may be selectively removed while leaving plurality of grains 26 on magnetic layer 22 to form a hard mask over portions of magnetic layer 22 (14). Subsequently, the unmasked portions of magnetic layer 22 may be removed (e.g., via etching) leaving only the portions of magnetic layer 22 masked by plurality of grains 26. In this manner, the pattern of plurality of grains 26, including grain size, in granular layer 24 may be transferred to magnetic layer 22. Following removal of the unmasked portion of magnetic layer 22, magnetic layer 22 may define discontinuous layer with discrete "grains" rather than a substantially continuous layer, e.g., as shown in FIG. 2c.

Any suitable material may be used to form granular layer 24. Granular layer 24 may be formed of materials that allow grain boundary 28 to be selectively removed (e.g., via etching) while leaving plurality of grains 26 on magnetic layer 22. Further, plurality of grains 26 may be formed of a material that allows for plurality of grains 26 to act as a hard mask that allows the unmasked portion of magnetic layer 22 to be removed (e.g., via etching) while leaving the masked portion of magnetic layer 22. For example, plurality of grains 26 may be removed at a relatively low rate during etching compared to the removal rate of the unmasked portions of magnetic layer 22. In some examples, granular layer 24 may be a granular $Ru$—$SiO_2$ layer in which plurality of grains 26 are Ru and grain boundary 28 is $SiO_2$. Other example materials for plurality of grains 26 include Re, Ta, Ti, NiAl, RuAl, FePt, and Fe. Other example materials for grain boundary 28 include $Al_2O_3$, $Ta_xO_y$, $TiO_2$, $Si_xN_y$, $Al_xN_y$, $Hf_xO_y$, and other oxides/nitrides.

Granular layer 24 may be selected to have a pattern (e.g. grain size, grain uniformity, grain distribution, and/or center-to-center distance between grains, grain boundary distance) that is desirable for a magnetic layer for magnetic layer 22. For example, the pattern of plurality of grains 26 may define a pattern such that magnetic layer 22 functions as magnetic recording layer for magnetic recording media with desirable properties once the unmasked portions magnetic layer 22 are removed. In some examples, the patterned magnetic layer 22 may define a grain size less than approximately 5 nanometers (nm), such as, e.g., less than approximately 4 nm, or less than approximately 3 nm. In some examples, the patterned magnetic layer 22 may define a grain size between approximately 2 nm and approximately 20 nm. The mean center-to-center distance between the grains of patterned magnetic layer 22 may be less than approximately 6 nanometers (nm), such as, e.g., less than approximately 5 nm. Further the patterned magnetic layer 22 may have a magnetic coercivity greater than approximately 2000 Oersted (Oe), such as, e.g., greater than approximately 5,000 Oe, greater than approximately 10,000 Oe, or greater than approximately 15,000 Oersted. In some examples, patterned magnetic layer 22 may have a dispersion of less than approximately 5%.

Magnetic layer 22 and granular layer 24 may be deposited using any suitable technique. Example deposition techniques include sputtering, thin film evaporation, chemical vapor deposition, ion beam sputtering, facing target sputtering, and laser beam ablation deposition. In some examples, during the formation of granular layer 24, an electrical field may be applied to induce the ordered structure of grains for the mask layer.

Magnetic layer 22 and granular layer 24 may be deposited to form a thin film layer with a suitable thickness. In some examples, magnetic layer 22 may have a thickness of less than approximately 20 nm, such as, e.g., between approximately 5 nm and approximately 20 nm. In some examples, granular layer 24 may have a thickness of less than approximately 10 nm such as, e.g., between approximately 1 nm and approximately 10 nm.

Grain boundary material 28 of granular layer 24 and the unmasked portions of magnetic layer 22 may be removed using any suitable technique. Example removal techniques include etching, such as, e.g., reactive ion etching, or ion beam milling process.

Although not shown in FIG. 1, in some examples, following the removal of the unmasked portions of magnetic layer 22, article 18 may undergo one or more processes to remove plurality of grains 24 from magnetic layer 22. For example, an ion beam milling process could be used to remove the grains 24. Additionally, the magnetic layer 22 may undergo one or more annealing steps following removal of the unmasked portions (16). The annealing may be performed, e.g., to use a lamp radiation method, and other rapid thermal annealing methods, e.g. laser heating. Example annealing conditions include heat treatment at a temperature above approximately 500 degrees Celsius for a duration greater than approximately 4 second, such as, e.g., between approximately 4 seconds and approximately 1 hour.

The deposition and/or removal processes described herein may be carried out in a vacuum environment. For example, such steps may be performed within an environment in which the pressure is less than approximately 500 mTorr, such as, e.g., less than approximately 10 mTorr. By performing all or some of the deposition and/or removal processes in a vacuum environment, impurities that result from exposure to a non-vacuum environment may be reduced or substantially eliminated from article 18. Example impurities include air borne particles and water vapor.

In some examples, the example technique of FIG. 1 may be carried out entirely within a vacuum environment. That is, the deposition of magnetic layer 22 (10) and granular layer 24(12) as well as the removal of grain boundary 28 (14) and unmasked portions of magnetic layer 22 (16) may all be performed in a vacuum environment. Further, the example technique of FIG. 1 may be carried out entirely within a vacuum environment without removing article 18 from the vacuum environment, i.e., article 18 remains in a vacuum environment from deposition of magnetic layer 22 on substrate 20 (10) until the unmasked portion of magnetic layer 22 is removed (16).

In some aspects, this disclosure relates to system and apparatus configured to perform one or more of fabrication techniques described herein. For example, FIGS. 3 and 4 are schematic diagrams illustrating example systems 28 and 38, respectively, for fabricating an article, e.g., article 18, using an embedded hard mask layer, e.g., granular layer 24, within a vacuum environment. Each to the example systems 28 and 38 may perform the fabrication technique of FIG. 1 within a vacuum environment.

As shown in FIG. 3, system 28 includes sputtering chamber 30 and etching chamber 32. Sputtering chamber 30 may be configured to sputter deposit magnetic layer 22 on substrate 20, e.g., such as wafer 36 (10) and sputter deposit granular layer 24 on magnetic layer 22 (12) within a vacuum environment. Etching chamber may be configured to remove grain boundary 28 (14) and unmasked magnetic layer 22 (16) via reactive etching within a vacuum environment. Sputtering chamber 30 is connected to etching chamber 32 via vacuum transfer region 34. Vacuum transfer region 34 allows for a substrate, such as, e.g., wafer 36 to be transferred between the chambers while maintaining a vacuum environment. In this manner, the sputtering and etching processes may take place in system 28 without subjecting the fabricated article to a non-vacuum environment, e.g., between formation of the magnetic and granular layers.

As shown in FIG. 4, system 38 includes first sputtering chamber 40, second sputtering chamber 42, and etching chamber 44. Each of the chamber 40, 42, and 44 are connected via vacuum transport regions 48. System 38 may be substantially similar to that of system 28 (FIG. 3). However, system 38 includes first and second sputtering chambers 40, 42 for the deposition of magnetic layer 22 and granular layer 24, respectively, rather than only one sputtering chamber as with system 28. Moreover, system 28 is configured to process discrete wafer 36 that is transferred from chamber to chamber while system 38 is configured to process continuous substrate 50 that may be transferred from chamber to chamber, e.g., using multiple rollers. System 38 may be particularly useful, e.g., when fabricating nanoparticles using a soft and flexible (e.g. polymer) substrate 50.

In this sense, although some of the example processes may be used for fabricating magnetic recording media, such as, e.g., article 18, for use in magnetic hard drives, the techniques and structures described herein may be applicable to other uses, such as fabrication of artificial nanoparticles and nanohole arrays with a low-cost process with high throughput. Other nanostructures include nanorings, nanodisks, and the like.

FIGS. 5a-5d are conceptual diagrams illustrating another example article 52 at various times during the fabrication process using an embedded hard mask layer within a vacuum environment. In particular, the fabrication process may be used to form a plurality of nanoparticles. In the example of FIG. 5a-5d, nanoparticles 70 with a Fe(Co)/Au/Fe(Co) multilayer structure are formed, e.g., for biosensing, although other compositions and applications are contemplated.

Figure 5A:
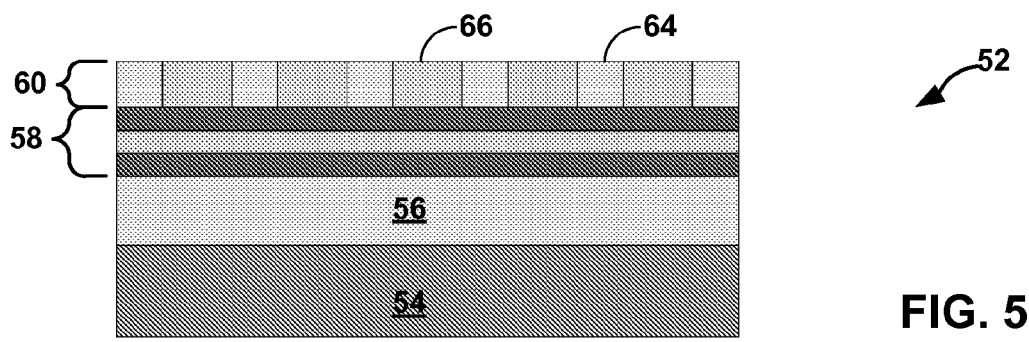
FIGS. 5a-5d are conceptual diagrams illustrating another example article at various times during the fabrication process using an embedded hard mask layer within a vacuum environment.

In FIG. 5a, article 52 includes $SiO_2$ layer 56 deposited on Si wafer 54. Magnetic stack 58 with a Fe(Co)/Au/Fe(Co) structure is formed on $SiO_2$ layer 56. Magnetic stack may have a continuous layer structure rather than granular layer structure. Granular layer 60 is formed on magnetic stack 58.

Granular layer 60 may be substantially the same or similar to that of granular layer 24 (FIGS. 2a-2c). As shown, granular layer 60 includes plurality of grains 66 formed of a first material and grain boundary 64 formed of a second material. In some examples, granular layer 60 may be a Au—$SiO_2$ layer with grains 66 formed of Au and grain boundary formed of $SiO_2$. Each of the layers of article 52 may be deposited using any suitable technique (e.g., sputtering).

Figure 5B:
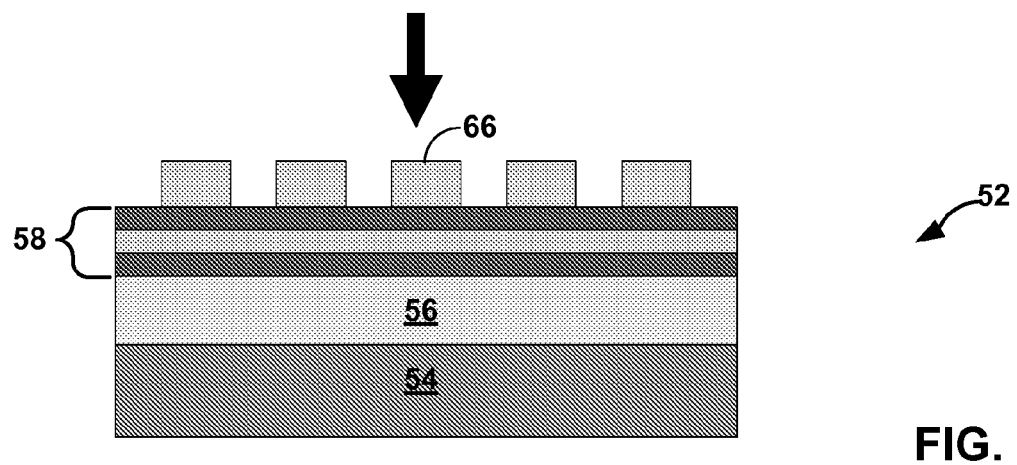
Figure 5C:
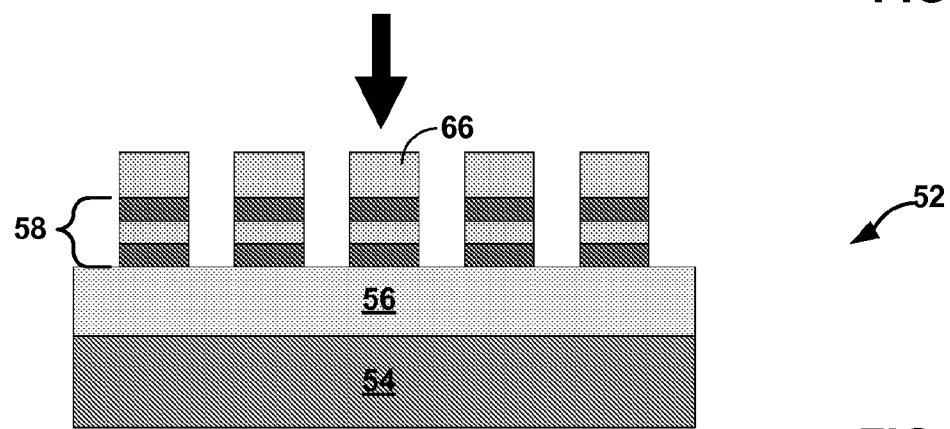
Figure 5D:
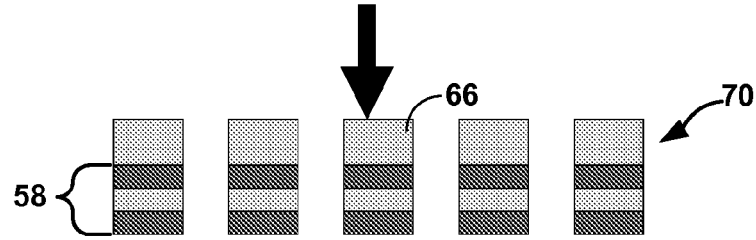

As shown in FIG. 5b, after granular layer 60 is formed, grain boundary 64 may be selectively removed, e.g., via etching such as reactive ion etching, while leaving plurality of grains 66 on magnetic stack 58 to form a hard mask over portions of magnetic stack 58. Subsequently, shown in FIG. 5c, the unmasked portions of magnetic stack 58 may be removed (e.g., via etching) leaving only the portions of magnetic stack 58 masked by plurality of grains 66 to form a magnetic dot array. In this manner, the pattern of plurality of grains 66 in granular layer 60 may be transferred to magnetic stack 58. Each of the "dots" defined by the remaining portions of magnetic stack 58 and grains 66 may be lifted from $SiO_2$ layer 56 and Si wafer 54 to form a plurality of nanoparticles (including nanoparticle 70) with a Fe(Co)/Au/Fe(Co)/Au stack structure. In some examples, nanoparticle 70 may have a grain size between approximately 2 nm to 100 nm.

More complicated stacks with multifunctions, e.g. Au/Fe/Ag/Fe/Au/Fe/Ag, with good and integrated magnetic and plasmonic performances may be patterned into nanoparticles or nanorings or nanoholes. In some examples, magnetic and plasmonic integrated nanostructures could be fabricated, e.g. Au/Ni/Au/Ni/Au, Au/Ag/Fe(Co)/Ag/Au, Au/Ag/$Fe_4N$/Ag/$Fe_4N$/Ag/Au, for magnetic sensing, drug delivery and hyperthermia, for example. As another example, more complicated stacks with bar code behavior, e.g., Au/Fe(t1)/Au/Fe(t2)/Au/Fe(t3)/Au/Fe(t4)/Au (where t1, t2, t3 and t4 refer to different thickness for Fe layer), could be patterned into nanostructure for different labeling and sensing purpose.

Similar to that of the process of FIG. 1, one or more of the fabrication steps of the process described with regard to FIGS. 5a-5d may be carried out within a vacuum environment. In some examples, each of the steps may be carried out entirely within a vacuum environment. In some examples, all of the steps may be carried out entirely within a vacuum environment without removing article 52 from the vacuum environment.

Other nanoparticle structures may be achieved using the technique illustrated with regard to FIGS. 5a-5d, e.g., based on the compositions of magnetic stack 58 and granular layer 60. For example, biocompatible $Fe_3Si$ and $Fe_5Si_3$ smart nanoparticles may be fabricated. As another example, Au/Fe(Co)/Ru/Fe(Co)/Au with different Ru layer thickness as magnetically and antiferromagnetically tunable nanoparticles may be fabricated. Other examples are contemplated.

FIGS. 6a-6d are conceptual diagrams illustrating another example article 72 at various times during the fabrication process using an embedded hard mask layer within a vacuum environment. In particular, the fabrication process may be used to form a nanohole array, e.g., for use in optical transmission or surface plasma resonance biosensing. In FIGS. 6a-6d, the nanohole array is defined in a Au layer. However, other suitable materials may be used other than that of Au.

Figure 6A:
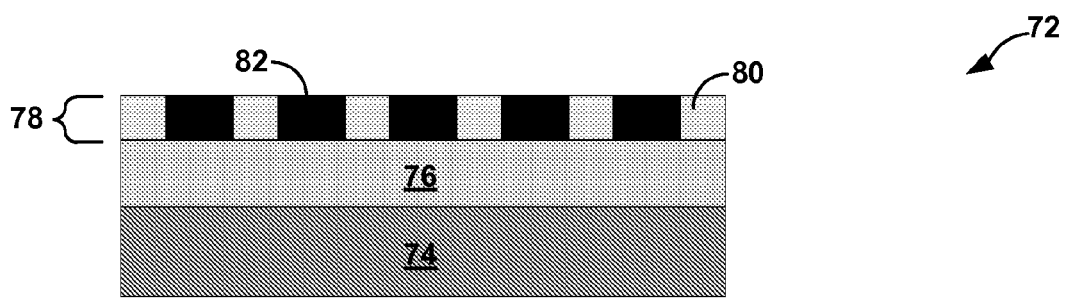
FIGS. 6a-6d are conceptual diagrams illustrating another example article at various times during the fabrication process using an embedded hard mask layer within a vacuum environment.

In FIG. 6a, article 72 includes Au thin film layer 76 deposited on substrate 74. Au layer 76 may be deposited as a substantially continuous film layer. In some examples, Au layer 70 may have a thickness between approximately 2 nm to 100 nm. Layer 70 may be formed of Au for surface plasmonic effect and it being substantially inert. Other suitable materials for layer 70 include Ag, ZrN, Fe4N, Ni, or combinations thereof. Layer 70 may include additives such as, e.g., Ag, Ti, N, Ni, Pd, Pt, Re, and/or Ru.

Granular layer 78 is formed on Au layer 76. Granular layer 78 may be substantially the same or similar to that of granular layer 24 (FIGS. 2a-2c) and granular layer 60 (FIGS. 5a-5d). As shown, granular layer 78 includes plurality of grains 80 formed of a first material and grain boundary 82 formed of a second material. In some examples, granular layer 60 may be a Pt—$SiO_2$ layer with grains 66 formed of $SiO_2$ and grain boundary formed of Pt. In other examples, granular layer 60 may be a Fe—$SiO_2$ layer. Each of the layers of article 52 may be deposited using any suitable technique (e.g., sputtering).

Figure 6B:
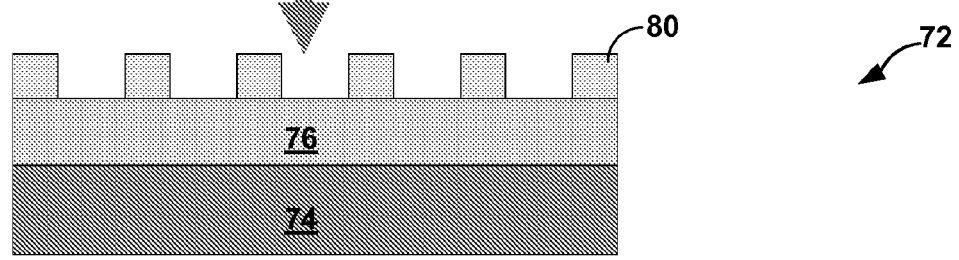
Figure 6C:
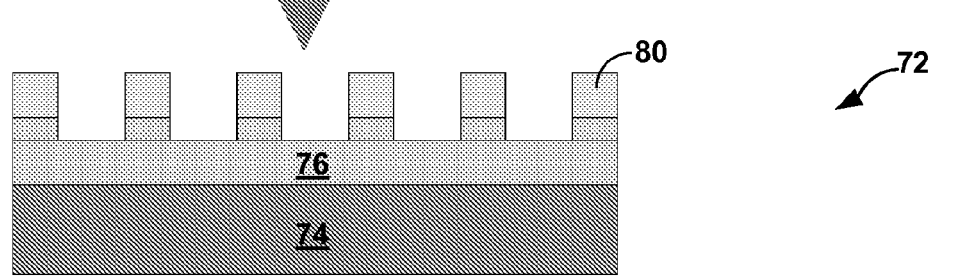
Figure 6D:
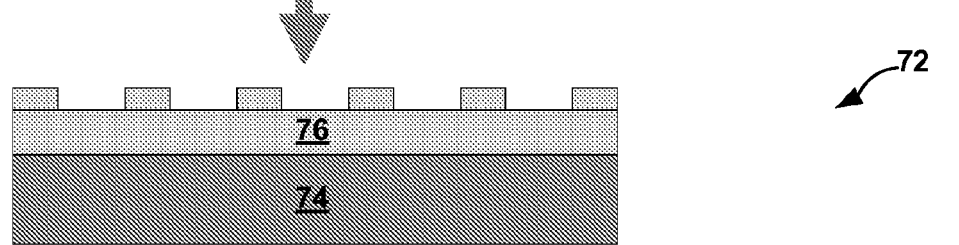

As shown in FIG. 6b, after granular layer 78 is formed, grain boundary 82 may be selectively removed, e.g., via methanol etching, while leaving plurality of grains 80 on Au layer 76 to form a hard mask over portions of Au layer 76. Subsequently, shown in FIG. 6c, the unmasked portions of Au layer 76 may be removed (e.g., via etching). However, unlike previously described, only a portion of the unmasked portion of Au layer 76 is removed rather than removing the unmasked portions all the way down to the underlying layer. In this manner, the masked portions of Au layer 76 have a thickness greater than that of the unmasked portions of Au layer 76 as defined by the $SiO_2$ mask. Grains 80 may be removed from Au layer 76, as shown in FIG. 6d, such that Au layer 76 defines a nanohole array. In some examples, the nanoholes in the resulting nanohole array may have a grain size between approximately 2 nm to 100 nm.

Similar to that of the process of FIG. 1, one or more of the fabrication steps of the process described with regard to FIGS. 6a-6d may be carried out within a vacuum environment. In some examples, each of the steps may be carried out entirely within a vacuum environment. In some examples, all of the steps may be carried out entirely within a vacuum environment without removing article 72 from the vacuum environment.

EXAMPLES

One or more experiments were carried out to evaluate one or more aspects of example of the disclosure. However, the disclosure is not limited by the description of the following experiments.

A sample article with a various thin film layers, including a magnetic layer, was prepared in accordance with the techniques described herein. For the deposition of the various thin film layers, an eight-target sputtering system was used. The thin films where deposited via sputtering on a single crystal MgO substrate. Prior to deposition of the thin film layers, the substrate heated to approximately 450 degrees Celsius. During deposition of the thin film layers, the pressure within the sputtering chamber was approximately 10 mTorr.

Following deposition of the thin film layers but prior to etching of the sample, the thin film structure was substrate/Cr/Pt/FePt/Ru—$SiO_2$. The Cr, Pt and FePt film layers were deposited as continuous films, while the Ru—$SiO_2$ was a granular film. Ru formed the grains and $SiO_2$ formed the grain boundary. The volume ratio of Ru to $SiO_2$ in the Ru—$SiO_2$ film layer was approximately 50 to 50. The thicknesses of the Cr, Pt, FePt, and Ru—$SiO_2$ film layers were approximately 12 nm, approximately 3 nm, approximately 5 nm, and approximately 3 nm, respectively.

Following deposition of the thin film layer, the sample underwent reactive ion etching to remove the $SiO_2$ from the Ru—$SiO_2$ granular film layer. For etching gases, $CF_4$ (fed at approximately 50 sccm) and $CHF_3$ (fed at approximately 25 sccm) were used. The working pressure within the etching chamber was approximately 75 mTorr. The RF power was approximately 150 watts and the etching time was approximately 2 minutes. Using these process conditions, it was determined that substantially all of the $SiO_2$ of the Ru—$SiO_2$ granular film layer was removed during the first etching step.

The sample then underwent a second etching step to transfer the pattern of the Ru grains of the granular thin film onto the FePt continuous film layer. For etching gases, Ar (fed at approximately 50 sccm) and $CH_3OH$ (fed at approximately 5 sccm) were used. The working pressure within the etching chamber was approximately 100 mTorr. The RF power was approximately 250 watts and the etching time was approximately 2 minutes. Using these process conditions, it was determined that the etching rate of Ru was relatively low and the etching rate of FePt was relatively high. In this manner, the Ru grains functioned as hard mask to pattern the underlying FePt film by removing the unmasked portions of the continuous FePt film layer.

Following the two etching steps, the sample was annealed in a vacuum environment at approximately 550 degrees Celsius for approximately 30 minutes to improve the FePt ordering, which was believed to be reduced during the etching process.

Figure 7:
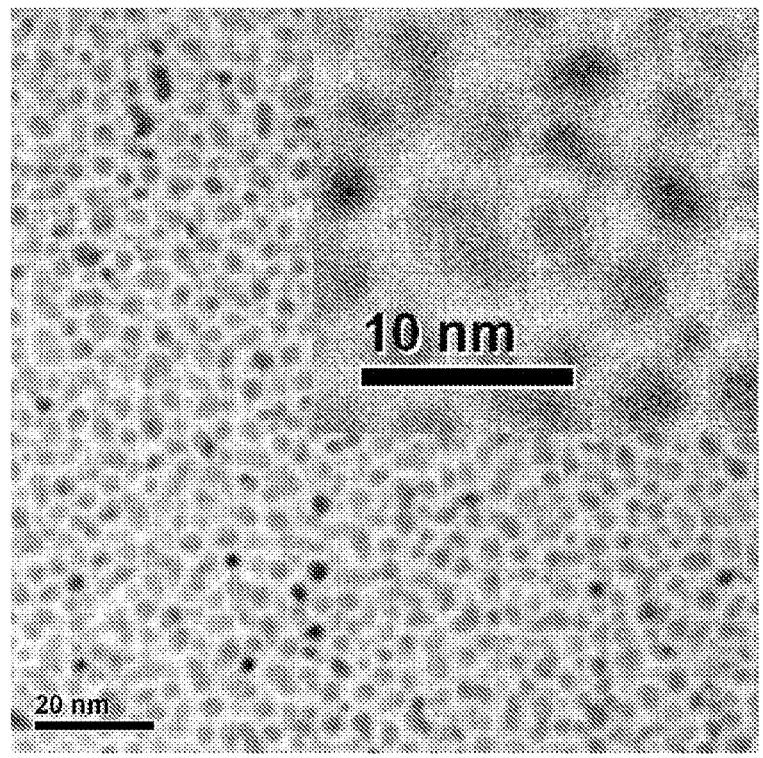
FIGS. 7, 11, 12a and 12B are images related to various experiments performed evaluate one or more aspects of the disclosure.

Throughout the above process, a variety of techniques were used to evaluate properties of the sample article. For example, FIG. 7 is a TEM image of the granular Ru—$SiO_2$ layer of the sample prior to the removal of the $SiO_2$ boundary layer material via etching. As shown, the Ru—$SiO_2$ film layer had an isolated grain structure.

Figure 8:
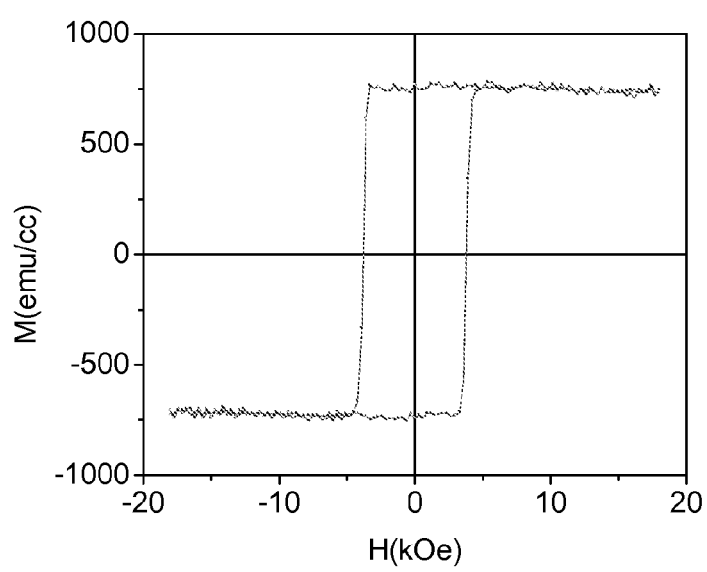
FIGS. 8, 9, 10a, 10b and 10c are graphs that illustrate results of various experiments performed evaluate one or more aspects of the disclosure.

FIG. 8 is a plot of the out-of-plane hysteresis loop of the FePt film layer prior to etching to remove portions of the FePt layer. The hysteresis loop is typical for a continuous magnetic film.

Figure 9:
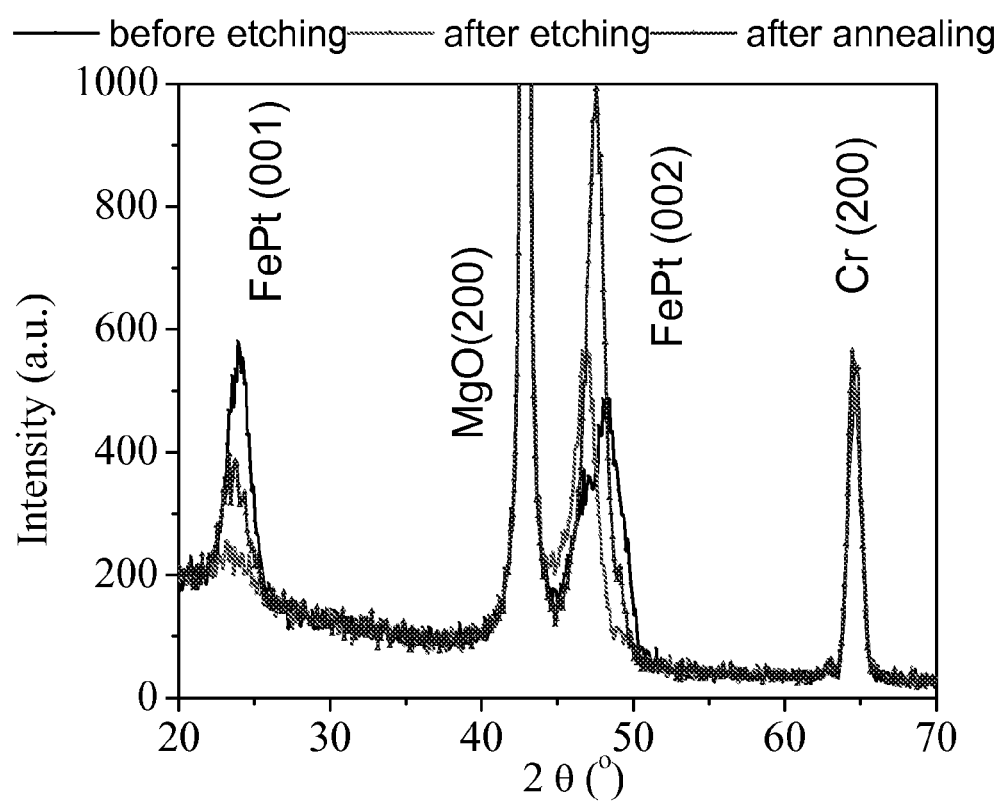

FIG. 9 is a XRD spectra comparison of the FePt magnetic layer prior to etching of the layer, after etching to remove the unmasked portion of the FePt magnetic layer, and after annealing of the FePt following etching of the magnetic layer. As shown, initially, the FePt layer had a strong (001) peak and good $L1_0$ ordering, but became almost disordered after etching. Subsequently, the ordering improved dramatically after annealing at 550° C. for approximately 30 minutes. As shown, following annealing strong (001) peak and good $L1_0$ ordering similar to that of layer prior to etching.

Figure 10B:
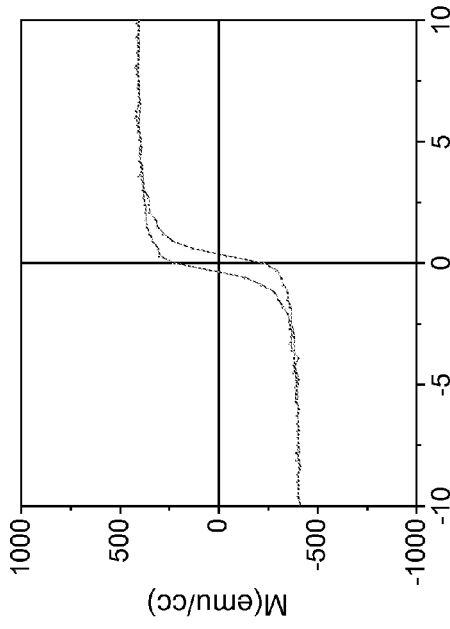
Figure 10C:
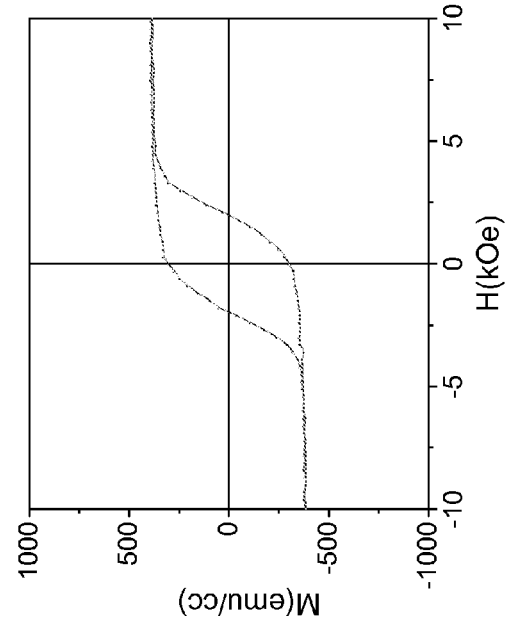
Figure 10A:
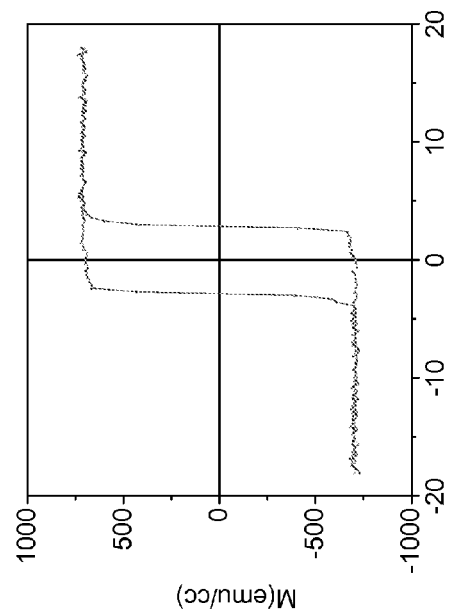

FIGS. 10a-10c are plots of hysteresis loops of the FePt magnetic layer prior to etching of the layer, after etching to remove the unmasked portion of the FePt magnetic layer, and after annealing of the FePt following etching of the magnetic layer, respectively. In FIG. 10a (prior to etching), the magnetic layer displayed a magnetic coercivity of approximately 2800 Oe. In FIG. 10b (after etching, before annealing), the magnetic layer displayed a magnetic coercivity of approximately 350 Oe. In FIG. 10c (after annealing), the magnetic layer displayed a magnetic coercivity of approximately 2000 Oe. As shown, both after etching and after annealing, the hysteresis loops displayed typical exchanged-decouple behavior.

Figure 11:
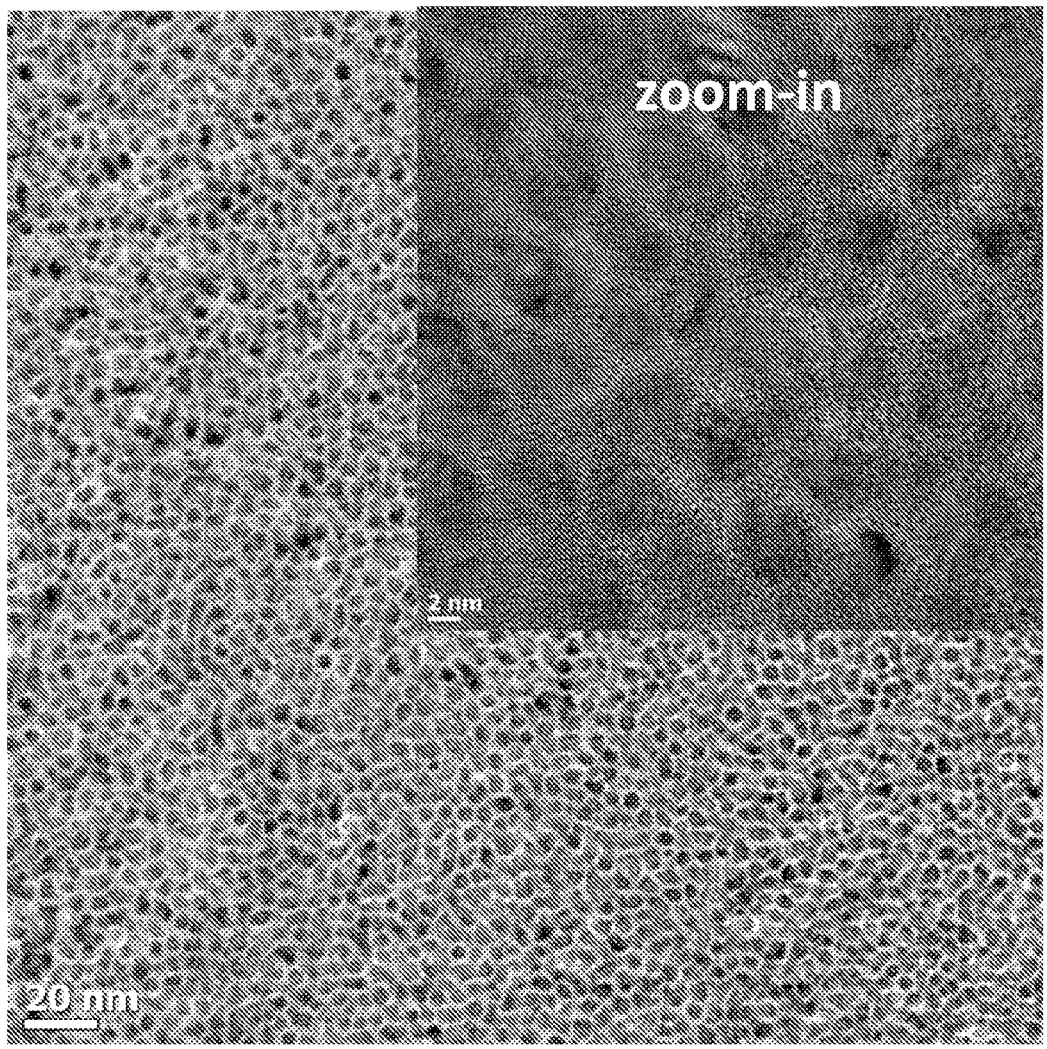

FIG. 11 is a TEM image of the magnetic layer following annealing of the sample, which shows the granular structure of the finalized sample. The grain size of the magnetic layer was determined to be no larger than approximately 5 nanometers and the center-to-center distance between grains was determined to be no larger than approximately 6 nanometers.

Figure 12A:
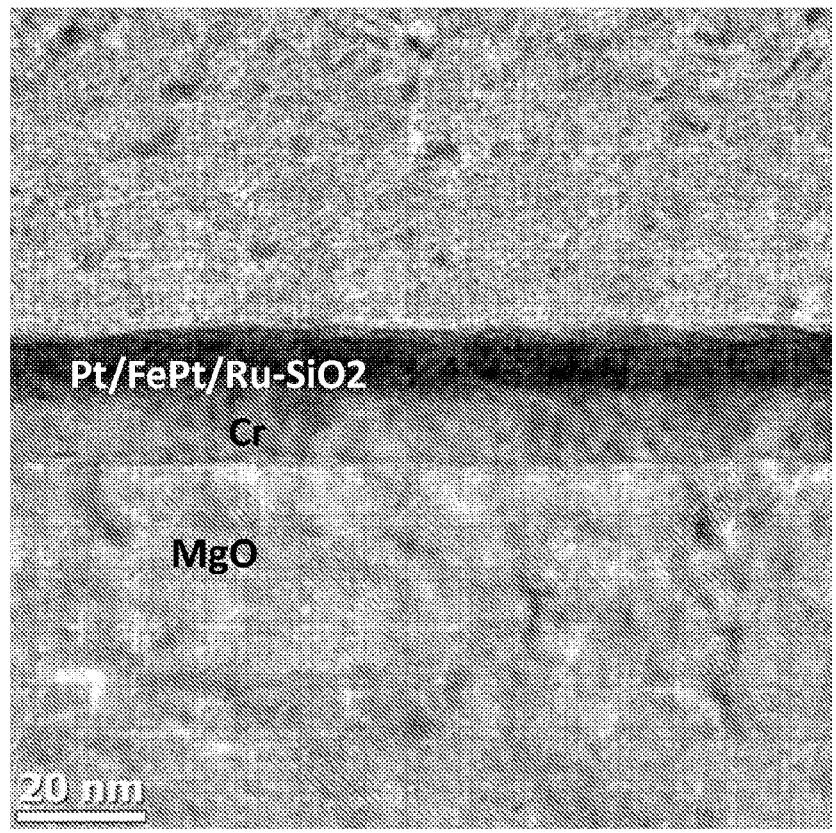
Figure 12B:
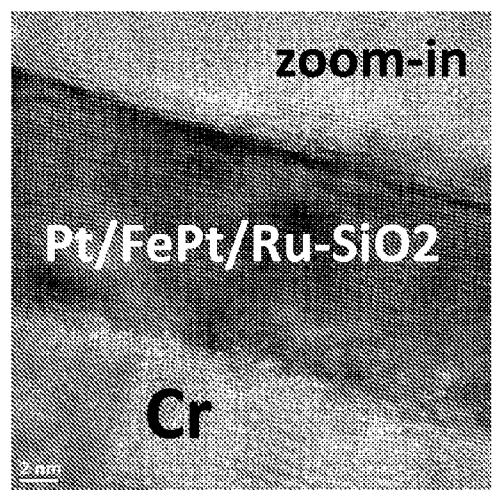

FIGS. 12a and 12b are TEM images of a cross-section of the finalized sample article. As labeled, the cross-sectional images show the MgO/Cr/Pt/Ru layer structure of the sample article. Both the Ru and patterned FePt grains are too small to be differentiated in the images. The overall thickness of the film structure in the finalized sample is substantially the same as that of the film structure prior to etching, indicating that the etching was highly anisotropic.

Various aspects of the disclosure have been described. These and other aspects are within the scope of the following claims.

The invention claimed is:

1. A method comprising:
depositing a functional layer over a substrate;
depositing a granular layer over the functional layer, the granular layer including a first material defining a plurality of grains separated by a second material defining grain boundaries of the plurality of grains, wherein the second material defining the grain boundaries of the plurality of grains comprises at least one of a metal oxide or nitride;
removing the second material from the granular layer such that the plurality of grains of the granular layer define a hard mask layer on the functional layer; and
removing portions of the functional layer not masked by the hard mask layer,
wherein the depositing of the functional layer, the depositing of the granular layer, removing the second material, and removing the portions of the functional layer are performed in a vacuum environment.

2. The method of claim 1, wherein the functional layer comprises at least one of FePt, CoPt, $SmCo_5$, $YCo_5$, FePd, or $[Co/Pd]_n$.

3. The method of claim 1, wherein the functional layer comprises a plurality of functional layers configured for multifunction, and wherein the plurality of functional layers define a Au/Fe/Au, Au/FeCo/Ru/FeCo/Ru, or Au/Ag/Fe/Ag/Au layer structure.

4. The method of claim 1, wherein the granular layer comprises Ru—$SiO_2$, the first material comprising Ru and the second material comprising $SiO_2$.

5. The method of claim 1, wherein removing portions of the functional layer not masked by the hard mask layer comprises removing portions of the functional layer not masked by the hard mask layer to define a patterned magnetic layer.

6. The method of claim 5, wherein a grain size of the patterned magnetic layer is less than approximately 5 nanometers and a coercivity of the patterned magnetic layer is greater than approximately 2000 Oersted.

7. The method of claim 1, further comprising at least one of heating the substrate or applying electrical field prior to depositing the granular layer.

8. The method of claim 1, further comprising annealing portions of the functional layer masked by the hard mask layer subsequent the removal of the portions of the functional layer not masked by the hard mask layer.

9. The method of claim 8, wherein the functional layer comprises FePt and the annealing occurs at approximately 350 degrees Celsius or higher for approximately five second or more.

10. The method of claim 1, wherein removing portions of the functional layer not masked by the hard mask layer comprises removing portions of the functional layer not masked by the hard mask layer to define a patterned layer on the substrate.

11. The method of claim 10, further comprising removing the patterned layer from the substrate so as to define nanoparticles, nanorings or different freestanding nanostructure.

12. The method of claim 10, further comprising removing the mask layer, subsequent removing the portions of the functional layer not masked by the hard mask layer, to define a nanohole array.

13. The method of claim 10, further comprising removing the patterned layer from the substrate so as to define freestanding nanostructures for different applications.

14. The method of claim 10, wherein the substrate comprises a substrate dissolvable in solution, and the method further comprising dissolving the substrate in solution to remove the patterned layer from the substrate.

15. The method of claim 1, further comprising depositing one or more intermediate layers over the substrate between the functional layer and the substrate.

16. The method of claim 1, wherein the functional layer comprises a plurality of functional layers defining nanostructures that function as magnetic, plasmonic and/or optical or integrated bar code or different coloring.

17. The method of claim 1, wherein the functional layer comprises a magnetic layer.

18. The method of claim 1, wherein the first material defining the plurality of grains includes at least one of Au, Ru, Re, Ta, Ti, NiAl, RuAl, FePt, Pt, or Fe.

19. The method of claim 1, wherein the second material defining the grain boundaries of the plurality of grains comprises at least one of $SiO_2$, $Al_2O_3$, $Ta_xO_y$, $TiO_2$, $Si_xN_y$, $Al_xN_y$, or $Hf_xO_y$.

20. The method of claim 1, wherein the first material comprises Au and the second material comprises $SiO_2$.

21. The method of claim 1, wherein the functional layer comprises a non-granular layer.

22. The method of claim 1, wherein the functional layer comprises a non-granular magnetic layer.

23. The method of claim 1, wherein depositing the granular layer over the functional layer comprises depositing the granular layer directly on the functional layer.

24. The method of claim 1, wherein removing the second material from the granular layer comprises removing the second material from the granular layer via reactive ion etching.

25. The method of claim 1, wherein removing portions of the functional layer not masked by the hard mask layer comprises removing portions of the functional layer not masked by the hard mask layer via reactive ion etching.

26. A method comprising:
depositing a functional layer over a substrate;
depositing a granular layer over the functional layer, the granular layer including a first material defining a plurality of grains separated by a second material defining grain boundaries of the plurality of grains, wherein the functional layer comprises a magnetic layer;
removing the second material from the granular layer such that the plurality of grains of the granular layer define a hard mask layer on the functional layer; and
removing portions of the functional layer not masked by the hard mask layer,
wherein the depositing of the functional layer, the depositing of the granular layer, removing the second material, and removing the portions of the functional layer are performed in a vacuum environment.

27. The method of claim 26, wherein the functional layer comprises a non-granular magnetic layer.

28. The method of claim 26, wherein the functional layer comprises at least one of FePt, CoPt, SmCo$_5$, YCo$_5$, FePd, or [Co/Pd]$_n$.

29. The method of claim 26, wherein the functional layer comprises a plurality of functional layers configured for multifunction, and wherein the plurality of functional layers define a Au/Fe/Au, Au/FeCo/Ru/FeCo/Ru, or Au/Ag/Fe/Ag/Au layer structure.

30. The method of claim 26, wherein the second material defining the grain boundaries of the plurality of grains comprises at least one of a metal oxide or nitride.

31. The method of claim 26, wherein the second material defining the grain boundaries of the plurality of grains comprises at least one of SiO$_2$, Al$_2$O$_3$, Ta$_x$O$_y$, TiO$_2$, Si$_x$N$_y$, Al$_x$N$_y$, or Hf$_x$O$_y$.

32. The method of claim 26, wherein the first material comprises Au and the second material comprises SiO$_2$.

33. The method of claim 26, wherein the first material defining the plurality of grains includes at least one of Au, Ru, Re, Ta, Ti, NiAl, RuAl, FePt, Pt, or Fe.

34. The method of claim 26, wherein the granular layer comprises Ru—SiO$_2$, the first material comprising Ru and the second material comprising SiO$_2$.

35. The method of claim 26, wherein removing the second material from the granular layer comprises removing the second material from the granular layer via reactive ion etching.

36. The method of claim 26, wherein removing portions of the functional layer not masked by the hard mask layer comprises removing portions of the functional layer not masked by the hard mask layer via reactive ion etching.

37. A method comprising:
depositing a functional layer over a substrate;
depositing a granular layer over the functional layer, the granular layer including a first material defining a plurality of grains separated by a second material defining grain boundaries of the plurality of grains, wherein the first material defining the plurality of grains includes at least one of Au, Ru, Re, Ta, Ti, NiAl, RuAl, FePt, Pt, or Fe;
removing the second material from the granular layer such that the plurality of grains of the granular layer define a hard mask layer on the functional layer; and
removing portions of the functional layer not masked by the hard mask layer,
wherein the depositing of the functional layer, the depositing of the granular layer, removing the second material, and removing the portions of the functional layer are performed in a vacuum environment.

38. The method of claim 37, wherein the functional layer comprises a magnetic layer.

39. The method of claim 37, wherein the functional layer comprises at least one of FePt, CoPt, SmCo$_5$, YCo$_5$, FePd, or [Co/Pd]$_n$.

40. The method of claim 37, wherein the functional layer comprises a plurality of functional layers configured for multifunction, and wherein the plurality of functional layers define a Au/Fe/Au, Au/FeCo/Ru/FeCo/Ru, or Au/Ag/Fe/Ag/Au layer structure.

41. The method of claim 37, wherein the second material defining the grain boundaries of the plurality of grains comprises at least one of a metal oxide or nitride.

42. The method of claim 37, wherein the second material defining the grain boundaries of the plurality of grains comprises at least one of SiO$_2$, Al$_2$O$_3$, Ta$_x$O$_y$, TiO$_2$, Si$_x$N$_y$, Al$_x$N$_y$, or Hf$_x$O$_y$).

43. The method of claim 37, wherein the first material comprises Au and the second material comprises SiO$_2$.

44. The method of claim 37, wherein the granular layer comprises Ru—SiO$_2$, the first material comprising Ru and the second material comprising SiO$_2$.

45. The method of claim 37, wherein removing the second material from the granular layer comprises removing the second material from the granular layer via reactive ion etching.

46. The method of claim 37, wherein removing portions of the functional layer not masked by the hard mask layer comprises removing portions of the functional layer not masked by the hard mask layer via reactive ion etching.

47. A method comprising:
depositing a functional layer over a substrate;
depositing a granular layer over the functional layer, the granular layer including a first material defining a plurality of grains separated by a second material defining grain boundaries of the plurality of grains;
removing the second material from the granular layer such that the plurality of grains of the granular layer define a hard mask layer on the functional layer;
removing portions of the functional layer not masked by the hard mask layer, wherein removing portions of the functional layer not masked by the hard mask layer comprises removing portions of the functional layer not masked by the hard mask layer to define a patterned layer on the substrate; and
removing the patterned layer from the substrate so as to define nanoparticles, nanorings or different freestanding nanostructure,
wherein the depositing of the functional layer, the depositing of the granular layer, removing the second material, and removing the portions of the functional layer are performed in a vacuum environment.

48. The method of claim 47, wherein removing the second material from the granular layer comprises removing the second material from the granular layer via reactive ion etching.

49. The method of claim 47, wherein removing portions of the functional layer not masked by the hard mask layer comprises removing portions of the functional layer not masked by the hard mask layer via reactive ion etching.

50. The method of claim 47, wherein the second material defining the grain boundaries of the plurality of grains comprises at least one of a metal oxide or nitride.

51. The method of claim 47, wherein the functional layer comprises a non-granular layer.

52. The method of claim 47, wherein the functional layer comprises a magnetic layer.

53. The method of claim 47, wherein the functional layer comprises a plurality of functional layers configured for multifunction, and wherein the plurality of functional layers define a Au/Fe/Au, Au/FeCo/Ru/FeCo/Ru, or Au/Ag/Fe/Ag/Au layer structure.

54. A method comprising:
depositing a functional layer over a substrate;
depositing a granular layer over the functional layer, the granular layer including a first material defining a plurality of grains separated by a second material defining grain boundaries of the plurality of grains;

removing the second material from the granular layer such that the plurality of grains of the granular layer define a hard mask layer on the functional layer;

removing portions of the functional layer not masked by the hard mask layer, wherein removing portions of the functional layer not masked by the hard mask layer comprises removing portions of the functional layer not masked by the hard mask layer to define a patterned layer on the substrate; and removing the mask layer, subsequent removing the portions of the functional layer not masked by the hard mask layer, to define a nanohole array, wherein the depositing of the functional layer, the depositing of the granular layer, removing the second material, and removing the portions of the functional layer are performed in a vacuum environment.

55. The method of claim 54, wherein the functional layer comprises at least one of Au, Ag, ZrN, Fe$_4$N, or Ni.

56. The method of claim 54, wherein removing the second material from the granular layer comprises removing the second material from the granular layer via reactive ion etching.

57. The method of claim 54, wherein removing portions of the functional layer not masked by the hard mask layer comprises removing portions of the functional layer not masked by the hard mask layer via reactive ion etching.

58. The method of claim 54, wherein the second material defining the grain boundaries of the plurality of grains comprises at least one of a metal oxide or nitride.

59. The method of claim 54, wherein the functional layer comprises a non-granular layer.

60. The method of claim 54, wherein the functional layer comprises a magnetic layer.

61. A method comprising:
depositing a functional layer over a substrate;
depositing a granular layer over the functional layer, the granular layer including a first material defining a plurality of grains separated by a second material defining grain boundaries of the plurality of grains;

removing the second material from the granular layer such that the plurality of grains of the granular layer define a hard mask layer on the functional layer;

removing portions of the functional layer not masked by the hard mask layer, wherein removing portions of the functional layer not masked by the hard mask layer comprises removing portions of the functional layer not masked by the hard mask layer to define a patterned layer on the substrate; and removing the patterned layer from the substrate so as to define free-standing nanostructures for different applications, wherein the depositing of the functional layer, the depositing of the granular layer, removing the second material, and removing the portions of the functional layer are performed in a vacuum environment.

62. The method of claim 61, wherein the free-standing structures comprise at least one of nanorings or nanodisks.

63. The method of claim 61, wherein the functional layer comprises a plurality of functional layers configured for multifunction, and wherein the plurality of functional layers define a Au/Ni/Au/Ni/Au, Au/Ag/Fe(Co)/Ag/Au, or Au/Ag/Fe$_4$N/Ag/Fe$_4$N/Ag/Au layer structure.

64. The method of claim 61, wherein the functional layer comprises a magnetic layer.

65. The method of claim 61, wherein removing the second material from the granular layer comprises removing the second material from the granular layer via reactive ion etching.

66. The method of claim 61, wherein removing portions of the functional layer not masked by the hard mask layer comprises removing portions of the functional layer not masked by the hard mask layer via reactive ion etching.

* * * * *